(12) United States Patent
Stulemeijer et al.

(10) Patent No.: US 12,294,340 B2
(45) Date of Patent: May 6, 2025

(54) SIGNAL AMPLIFICATION CIRCUITRY

(71) Applicant: QUALCOMM Incorporated, San Diego, CA (US)

(72) Inventors: Jiri Stulemeijer, Heerlen (NL); Christos Komninakis, Solana Beach, CA (US); Robert Wilson, San Diego, CA (US); Hakan Inanoglu, Acton, MA (US); Ryan Scott Castro Spring, San Diego, CA (US); Antonino Scuderi, San Diego, CA (US); Michael Lee McCloud, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 525 days.

(21) Appl. No.: 17/805,168

(22) Filed: Jun. 2, 2022

(65) Prior Publication Data

US 2023/0396219 A1 Dec. 7, 2023

(51) Int. Cl.
*H03F 1/32* (2006.01)
*H03F 1/02* (2006.01)
*H03F 3/24* (2006.01)

(52) U.S. Cl.
CPC ........... *H03F 3/245* (2013.01); *H03F 1/0227* (2013.01); *H03F 1/3247* (2013.01); *H03F 2200/105* (2013.01); *H03F 2200/451* (2013.01); *H03F 2201/3233* (2013.01)

(58) Field of Classification Search
CPC ........................................................ H03F 1/32

USPC ................................................... 330/149, 279
See application file for complete search history.

(56) References Cited

U.S. PATENT DOCUMENTS

| | | | |
|---|---|---|---|
| 9,041,464 B2 | 5/2015 | Komninakis et al. | |
| 2014/0118072 A1 | 5/2014 | Briffa et al. | |

FOREIGN PATENT DOCUMENTS

| | | |
|---|---|---|
| WO | 2019117888 A1 | 6/2019 |
| WO | 2020206246 A1 | 10/2020 |

OTHER PUBLICATIONS

International Search Report and Written Opinion—PCT/US2023/067287—ISA/EPO—Sep. 18, 2023.

*Primary Examiner* — Henry Choe
(74) *Attorney, Agent, or Firm* — Patterson+ Sheridan, L.L.P.

(57) ABSTRACT

Aspects of the present disclosure provide signal amplification. An example method generally includes amplifying a version of a first input signal with a power amplifier in a first state where a bias voltage of the power amplifier is set to a first voltage based on a first tracking mode; obtaining a first output signal of the power amplifier in a second state where the bias voltage is set to a second voltage less than the first voltage; determining a predistortion associated with the power amplifier based at least in part on the obtained first output signal; applying the predistortion to the first input signal; and amplifying a version of the predistorted first input signal with the power amplifier in a third state where the bias voltage is set to a third voltage based on a second tracking mode, wherein the third voltage is less than the first voltage.

30 Claims, 9 Drawing Sheets

SIGNAL AMPLIFICATION CIRCUITRY

BACKGROUND

Field of the Disclosure

Certain aspects of the present disclosure generally relate to electronic circuits and, more particularly, to signal amplification circuitry.

Description of Related Art

Electronic device technologies have seen explosive growth over the past several years. For example, growth of cellular and wireless communication technologies has been fueled by better communications, more capable hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Increasing efficiency of electronic devices is becoming more and more important as consumers demand longer battery life for devices. One technique for increasing battery life is to improve the efficiency of power supply circuitry for the electronic devices.

Integrated circuits (IC) are often powered using various power supply circuits such as a power supply that provides a constant output voltage (e.g., a voltage regulator, such as a low-dropout regulator (LDO)) or a switched-mode power supply (SMPS) that provides a variable voltage. The variable voltage output by the SMPS may facilitate efficient operation of an IC in terms of power consumption. The desired supply output voltage may be adjusted based on various techniques including average power tracking (APT), continuous envelope tracking (CET), or discrete envelope tracking (DET).

In certain cases, a wireless communication device may include a radio frequency (RF) transceiver (also referred to as a radio frequency front-end) for transmitting and/or receiving RF signals. On the transmit side, the RF transceiver may include an SMPS that supplies power to a power amplifier for amplifying the RF signals before transmission. Wireless communication devices are widely deployed to provide various communication services such as telephony, video, data, messaging, broadcasts, and so on. Such wireless communication devices may transmit and/or receive RF signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., Wi-Fi), and the like.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that reduce power consumption and allow for online calibration.

Certain aspects of the present disclosure provide a method of signal amplification. The method generally includes amplifying a version of a first input signal with a power amplifier in a first state where a bias voltage of the power amplifier is set to a first voltage based on a first tracking mode; obtaining a first output signal of the power amplifier in a second state where the bias voltage is set to a second voltage less than the first voltage; determining a predistortion associated with the power amplifier based at least in part on the obtained first output signal; applying the predistortion to the first input signal; and amplifying a version of the predistorted first input signal with the power amplifier in a third state where the bias voltage is set to a third voltage based on a second tracking mode, wherein the third voltage is less than the first voltage.

Certain aspects of the present disclosure provide a method of signal amplification. The method generally includes obtaining a first output signal of a power amplifier in a first state where a bias voltage is set to a first voltage less than a second voltage determined based on a first tracking mode; determining a predistortion associated with the power amplifier based at least in part on the obtained first output signal; applying the predistortion to a first input signal of the power amplifier; and amplifying a version of the predistorted first input signal with the power amplifier in a second state where the bias voltage is set to a third voltage based on a second tracking mode, wherein the third voltage is less than the first voltage.

Certain aspects of the present disclosure provide an apparatus for signal amplification. The apparatus generally includes a power amplifier, a power supply coupled to the power amplifier, a memory comprising executable instructions, and a controller. The controller is coupled to the memory, to the power amplifier, and to the power supply. The controller is configured to execute the executable instructions and cause the apparatus to amplify a version of a first input signal with the power amplifier in a first state where a bias voltage of the power amplifier is set to a first voltage with the power supply based on a first tracking mode, obtain a first output signal of the power amplifier in a second state where the bias voltage is set to a second voltage with the power supply, wherein the second voltage is less than the first voltage, determine a predistortion associated with the power amplifier based at least in part on the obtained first output signal, apply the predistortion to the first input signal, and amplify a version of the predistorted first input signal with the power amplifier in a third state where the bias voltage is set to a third voltage with the power supply based on a second tracking mode, wherein the third voltage is less than the first voltage.

Certain aspects of the present disclosure provide an apparatus for signal amplification. The apparatus generally includes a power amplifier, a power supply coupled to the power amplifier, a memory comprising executable instructions, and a controller. The controller is coupled to the memory, to the power amplifier, and to the power supply. The controller is configured to execute the executable instructions and cause the apparatus to obtain a first output signal of a power amplifier in a first state where a bias voltage is set to a first voltage less than a second voltage determined based on a first tracking mode, determine a predistortion associated with the power amplifier based at least in part on the obtained first output signal, apply the predistortion to a first input signal of the power amplifier, and amplify a version of the predistorted first input signal with the power amplifier in a second state where the bias voltage is set to a third voltage based on a second tracking mode, wherein the third voltage is less than the first voltage.

Certain aspects of the present disclosure provide an apparatus for signal amplification. The apparatus generally includes means for amplifying a version of a first input signal with a power amplifier in a first state where a bias voltage of the power amplifier is set to a first voltage based on a first tracking mode; means for obtaining a first output signal of the power amplifier in a second state where the bias voltage is set to a second voltage less than the first voltage; means for determining a predistortion associated with the power amplifier based at least in part on the obtained first output signal; means for applying the predistortion to the first input signal; and means for amplifying a version of the predistorted first input signal with the power amplifier in a third state where the bias voltage is set to a third voltage based on a second tracking mode, wherein the third voltage is less than the first voltage.

Certain aspects of the present disclosure provide an apparatus for signal amplification. The apparatus generally includes means for obtaining a first output signal of a power amplifier in a first state where a bias voltage is set to a first voltage less than a second voltage determined based on a first tracking mode; means for determining a predistortion associated with the power amplifier based at least in part on the obtained first output signal; means for applying the predistortion to a first input signal of the power amplifier; and means for amplifying a version of the predistorted first input signal with the power amplifier in a second state where the bias voltage is set to a third voltage based on a second tracking mode, wherein the third voltage is less than the first voltage.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
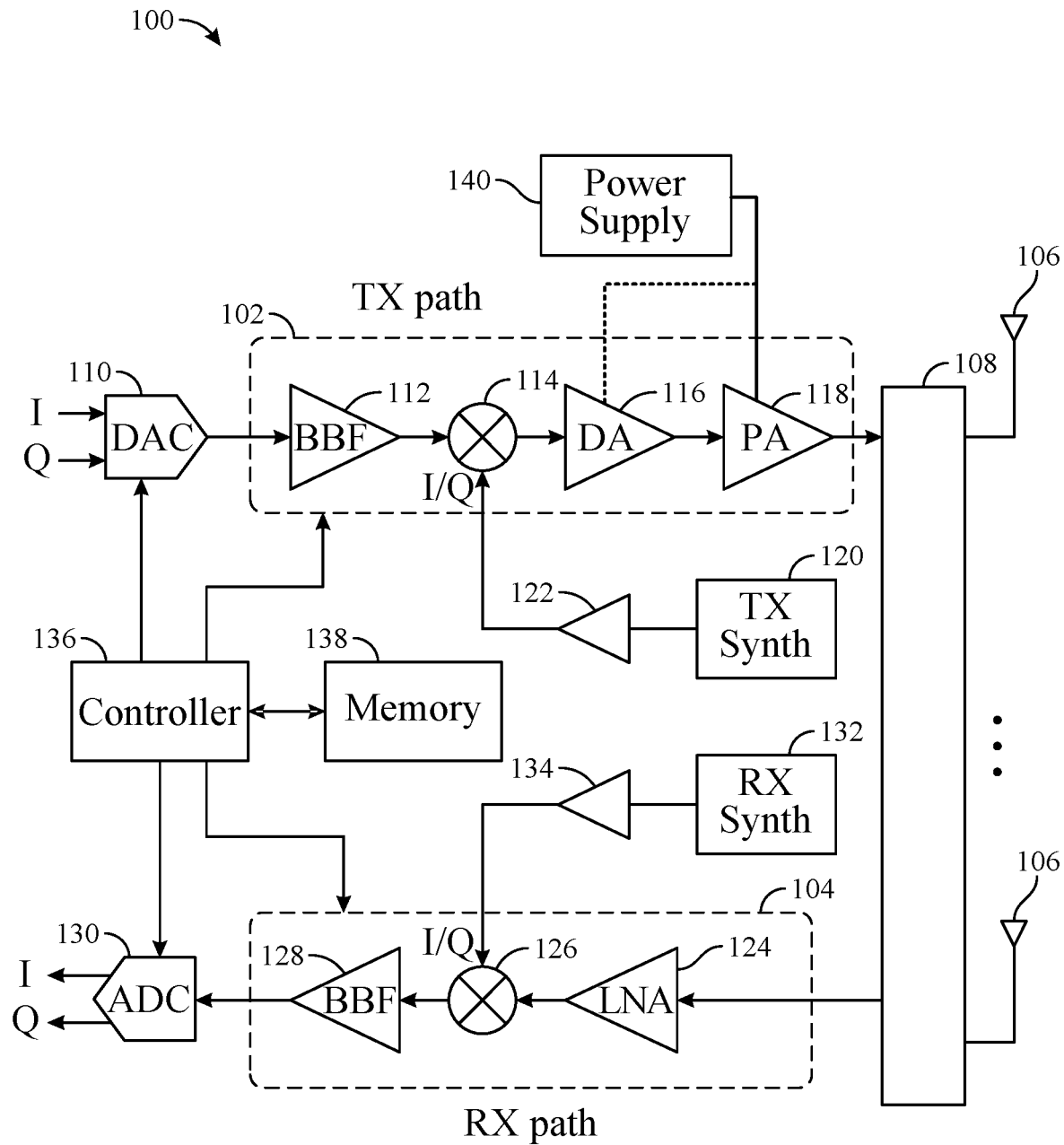
FIG. 1 is a block diagram of an example radio frequency transceiver.

Certain aspects of the present disclosure relate to signal amplification circuitry and a method of signal amplification.

A wireless communication device may include a transceiver (also referred to as a radio frequency front-end (RFFE) circuit or RF transceiver circuit) for transmitting and/or receiving RF signals. The transceiver may include a power supply circuit to provide a variable power supply voltage (e.g., $V_{CC}$) to a power amplifier (PA) for power efficiency, for example, through average power tracking (APT) or envelope tracking (ET). It will be appreciated that the term "supply voltage" may refer to a bias voltage of the PA. Certain characteristics associated with the PA may be calibrated to implement APT with predistortion, where the calibration may be performed by the manufacturer at the factory before deploying the wireless communication device. For example, the input power of the PA, the output power of the PA, and gain levels of the transceiver circuitry may be calibrated for different supply voltages and/or predistortions applied to the PA for APT. The factory calibration may be static, which may not account for variations in the PA performance due to temperature and/or frequency changes. In some cases, the factory calibration may increase the cost to manufacture the wireless communication device due to the added time to perform the calibration.

Certain aspects of the present disclosure provide methods and apparatus for signal amplification that use online feedback to determine a predistortion and a bias voltage level applied to a power amplifier. Online feedback may refer to information about certain operating conditions of a transceiver, such as an input voltage of a power amplifier, an output voltage of the power amplifier, a bias voltage of the power amplifier, etc. As an example, at a start of new transmission conditions, or shortly thereafter, the bias voltage may be reduced to operate the power amplifier in a certain compression for a predistortion characterization capture. As used herein, the term "compression" generally relates to the reduction in gain factor associated with an amplifier, often expressed in decibels, of the peaks of the signal, relative to the gain of the lowest powers in the modulated signal. The predistortion characterization capture may include capturing data in some condition (e.g., a power amplifier operating at a certain compression) to be able to determine predistortion parameters. In some cases, the predistortion characterization capture may include a processor sampling the input signal and output signal of a power amplifier operating at a certain compression, for example. After the predistortion capture and while the predistortion is being determined, the power amplifier may be operated at a low compression level with a higher bias voltage. When predistortion parameters are determined, the bias voltage may be set to a level between the characterization capture level and the low compression level.

The apparatus and methods described herein may lower a bias voltage applied to the PA in APT mode based on feedback of the PA operating with or without predistortion. The feedback may be used to determine a predistortion that allows for the lowered bias voltage. In certain cases, the predistortion characterizations may be reused for certain bias voltages or output powers. In some cases, the predistortion may be determined to meet certain performance metric(s), such as a compression point, adjacent channel leakage ratio (ACLR), output power (e.g., Pout), etc.

The methods and apparatus for signal amplification described herein may provide various advantages. For example, the online feedback may enable operating the PA at a lower bias voltage without factory calibration, which will be desirable to wireless device manufacturers. The signal amplification described herein may provide increased power efficiency by operating the PA at a lower bias voltage. The predistortion may allow for desirable PA performance, such as a certain linearity, a low adjacent channel leakage ratio (ACLR), and/or a low error vector magnitude (EVM).

Example RF Transceiver

FIG. 1 is a block diagram of an example RF transceiver circuit 100, in accordance with certain aspects of the present disclosure. The RF transceiver circuit 100 includes at least one transmit (TX) path 102 (also known as a "transmit chain") for transmitting signals via one or more antennas 106 and at least one receive (RX) path 104 (also known as a "receive chain") for receiving signals via the antennas 106. When the TX path 102 and the RX path 104 share an antenna 106, the paths may be connected with the antenna via an interface 108, which may include any of various suitable RF devices, such as a switch, a duplexer, a diplexer, a multiplexer, and the like.

Receiving in-phase (I) or quadrature (Q) baseband analog signals from a digital-to-analog converter (DAC) 110, the TX path 102 may include a baseband filter (BBF) 112, a mixer 114, a driver amplifier (DA) 116, and a power amplifier (PA) 118. The BBF 112, the mixer 114, the DA 116, and the PA 118 may be included in a radio frequency integrated circuit (RFIC).

In certain aspects, a power supply 140 may provide a variable supply voltage to the PA 118 (and/or DA 116) to facilitate efficient operation of the PA 118 (and/or DA 116) in terms of power consumption. For example, the power supply 140 may include a switched-mode power supply (SMPS) configured to operate in APT mode and/or ET mode. The supply voltage of the power supply 140 may be adjusted using various techniques including APT and/or ET.

The BBF 112 filters the baseband signals received from the DAC 110, and the mixer 114 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 114 are typically RF signals, which may be amplified by the DA 116 and/or by the PA 118 before transmission by the antenna 106.

The RX path 104 may include a low noise amplifier (LNA) 124, a mixer 126, and a baseband filter (BBF) 128. The LNA 124, the mixer 126, and the BBF 128 may be included in a RFIC, which may or may not be the same RFIC that includes the TX path components. RF signals received via the antenna 106 may be amplified by the LNA 124, and the mixer 126 mixes the amplified RF signals with a receive local oscillator (LO) signal to convert the RF signal of interest to a different baseband frequency (e.g., downconvert). The baseband signals output by the mixer 126 may be filtered by the BBF 128 before being converted by an analog-to-digital converter (ADC) 130 to digital I or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO frequency may be produced by a TX frequency synthesizer 120, which may be buffered (e.g., applying a unity gain), attenuated, or amplified by amplifier 122 before being mixed with the baseband signals in the mixer 114. Similarly, the receive LO frequency may be produced by an RX frequency synthesizer 132, which may be buffered or amplified by amplifier 134 before being mixed with the RF signals in the mixer 126. For certain aspects, a single frequency synthesizer may be used for both the TX path 102 and the RX path 104.

A controller 136 may direct the operation of the RF transceiver circuit 100, such as transmitting signals via the TX path 102 and/or receiving signals via the RX path 104. In certain aspects, the controller 136 may perform operations further described herein to obtain feedback associated with the PA 118 and determine a predistortion that allows for a lowered bias voltage of the PA 118. The controller 136 may be a processor, a digital signal processor (DSP), an application specific integrated circuit (ASIC), a field programmable gate array (FPGA) or other programmable logic device (PLD), discrete gate or transistor logic, discrete hardware components, or any combination thereof. The memory 138 may store data and program codes for operating the RF transceiver circuit 100. The controller 136 and/or memory 138 may include control logic (e.g., CMOS logic).

While FIG. 1 provides an RF transceiver as an example application in which certain aspects of the present disclosure may be implemented to facilitate understanding, certain aspects described herein related to signal amplification may be utilized in various other suitable electronic systems.

Example Signal Amplification

Figure 2:
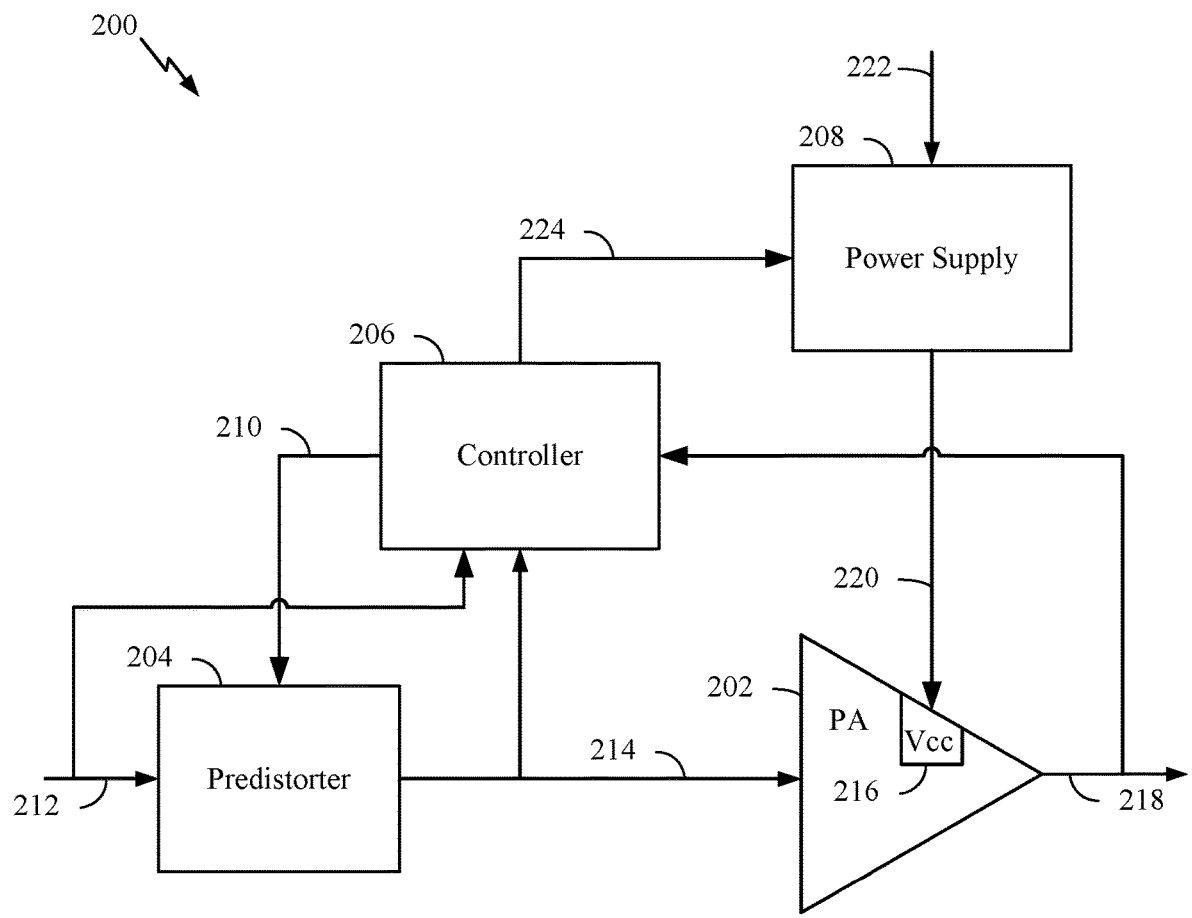
FIG. 2 is a block diagram illustrating example circuitry for signal amplification.

FIG. 2 is a block diagram illustrating example circuitry 200 for signal amplification. The circuitry 200 includes a power amplifier 202, a predistorter 204, a controller 206, and a power supply 208. The elements or components included in the circuitry 200 (e.g., the predistorter 204, the controller 206, and/or the power supply 208) may be implemented in hardware, software, or a combination of both. For example, one or more of the elements or components included in the circuitry 200 may be implemented in circuitry, circuit components (e.g., resistors, transistors, capacitors, inductors, etc.), memory blocks, registers, processing blocks and/or in instructions (e.g., software code) stored in memory that are executed on a processor. FIG. 2 is just one example of a signal amplification circuitry, and other circuitry including fewer, additional, or alternative elements or components are possible consistent with this disclosure. For example, additional or alternative elements or components may be arranged between the predistorter 204 and the power amplifier 202 as further described herein with respect to FIG. 6.

The circuitry 200 may be an example of circuitry used in a transceiver, such as the circuitry associated with the transmit chain 102 of the RF transceiver circuit 100. For example, the power amplifier 202 may be representative of the power amplifier 118, the controller 204 may be representative of the controller 136, and the power supply 208 may be representative of the power supply 140.

The controller 206 provides a predistortion control signal 210 to the predistorter 204. The predistortion control signal 210 may indicate a particular predistortion to apply to a first input signal 212 (e.g., a digital version of the input signal) with the predistorter 204. The predistortion control signal 210 may cause the predistorter 204 to apply the particular predistortion to the first input signal 212. For example, the predistortion control signal 210 may indicate one or more parameters associated with a particular predistortion. In some cases, the predistortion control signal 210 may indicate a set of parameters in a look-up table (LUT) that defines multiple predistortions. For example, the look-up table may be associated with various amplitude-to-amplitude modulation (AMAM) and/or an amplitude-to-phase modulation (AMPM) compensation(s) for predistortion. In certain cases, the predistortion control signal 210 may indicate certain information that functionally defines the predistortion, such as parameter(s) indicative of the predistortion based on one or more of a polynomial function, Volterra model, piecewise function, etc.

A control input of the predistorter 204 may be coupled to the controller 206, and an output of the predistorter 204 may be coupled to an input of the power amplifier 202. The predistorter 204 may apply a predistortion to the first input signal 212 and output a second input signal 214, which is conditioned by the predistortion. For example, the predistorter 204 may apply the predistortion as specified by the predistortion control signal 210. The predistorter 204 may apply the predistortion in response to the predistortion control signal 210.

The power amplifier 202 may amplify the second input signal 214, which may be modified by the predistortion (e.g., predistorted) or not modified by the predistortion. The power amplifier 202 may increase the amplitude of the second input signal 214 for wireless transmission. The power amplifier 202 may output an amplified version of the second input signal 214, which may be referred to as the output signal 218. A power supply input of the power amplifier 202 may be coupled to the power supply 208. For example, the power amplifier 202 may be coupled to the power supply 208 via a power terminal 216 (e.g., $V_{CC}$) of the power amplifier 202. The performance of the power amplifier 202 may vary based on a bias voltage 220 that is output by the power supply 208, where the bias voltage 220 may be applied to the power terminal 216. For example, the magnitude of the amplification provided by the power amplifier 202 and/or the linearity of the power amplifier 202 may vary based on a voltage level of the bias voltage 220.

In some cases, the predistortion control signal 210 may indicate to disable the predistortion at the predistorter 204. For example, the predistorter 204 may refrain from applying a predistortion to the first input signal 212 in response to the predistortion control signal 210. With the predistortion disabled, the controller 206 may obtain samples of the output signal 218 and/or the second input signal 214 to determine a suitable predistortion for the power amplifier 202 given the bias voltage 220 applied to the power amplifier 202 as further described herein. For example, the controller 206 may capture samples of the output signal 218 and/or the second input signal 214 when the bias voltage 220 is set to a lower voltage. In certain cases, the controller 206 may obtain samples of the output signal 218 with the predistortion being applied to the first input signal 212. The controller 206 may sample the first input signal 212, the second input signal 214, and/or and the output signal 218 when predistortion is applied by the predistorter 204 or when the predistorter 204 is refraining from applying predistortion, as further described herein.

The power supply 208 may regulate a source voltage 222 to output the bias voltage 220 based on a power supply control signal 224 output by the controller 206. In certain cases, the power supply 208 may include a direct current-to-direct current (DC-to-DC) converter, such as a switched-mode power supply (SMPS). The power supply 208 may convert the source voltage 222 to a particular voltage level for the bias voltage 220. The source voltage 222 may be provided by a battery, a power adapter, another power supply, and/or some other source, for example.

The controller 206 is coupled to the power amplifier 202, to the power supply 208, and to the predistorter 204. The controller 206 controls the power supply 208 and the predistorter 204 based at least in part on the second input signal 214 and the output signal 218 of the power amplifier 202. The controller 206 may determine a predistortion for the predistorter 204 based on the output signal 218, the first input signals 212, and/or the second input signal 214. The predistortion may allow for the power amplifier 202 to amplify the second input signal 214 using a reduced bias voltage 220 as further described herein.

The controller 206 may provide the power supply control signal 224 to the power supply 208, where the power supply control signal 224 may indicate the voltage level for the bias voltage 220. The power supply control signal 224 may cause the power supply 208 to output the bias voltage 220 at the voltage level indicated by the power supply control signal 224. For example, the power supply control signal 224 may be indicative of a codepoint or bitmap associated with a particular voltage level of the bias voltage 220. In some cases, the power supply control signal 224 may have a voltage proportional to the voltage level of the bias voltage 220. The power supply 208 may obtain the power supply control signal 224 and determine the voltage level for the bias voltage 220 based on the power supply control signal 224. In some cases, the power supply 208 may adjust the voltage level for the bias voltage 220 in response to the power supply control signal 224.

Applying the predistortion to the first input signal 212 may enable the power amplifier 202 to operate with a lower bias voltage while still producing the output signal 218 that satisfies one or more criteria. Examples of the one or more criteria include one or more specified values for adjacent channel leakage ratio (ACLR), adjacent channel power ratio (ACPR), peak-to-average power ratio (PAPR), error vector magnitude (EVM), output power (e.g., Pout), receive band noise (RxBN), gain of the transmit chain and/or power of the transmit chain. For example, gain or power may be equivalent from the transmit point of view. If the gain is known, for instance, then knowing the transmit signal (e.g., the second input signal 214) that the baseband transmitter generates may enable prediction of the output power of the device (e.g., circuitry 200).

In certain aspects, the predistorter 204 and the controller 206 may be implemented in hardware, software, or a combination of both in the same processor. For example, a processor may determine a predistortion and apply the predistortion to a digital version of the first input signal 212. In such cases, the predistortion control signal 210 may not be used between the predistorter 204 and the controller 206. The predistortion control signal 210 may be representative of the predistortion controls implemented by a processor configured to preform the functions of the predistorter 204 and the controller 206.

Figure 3:
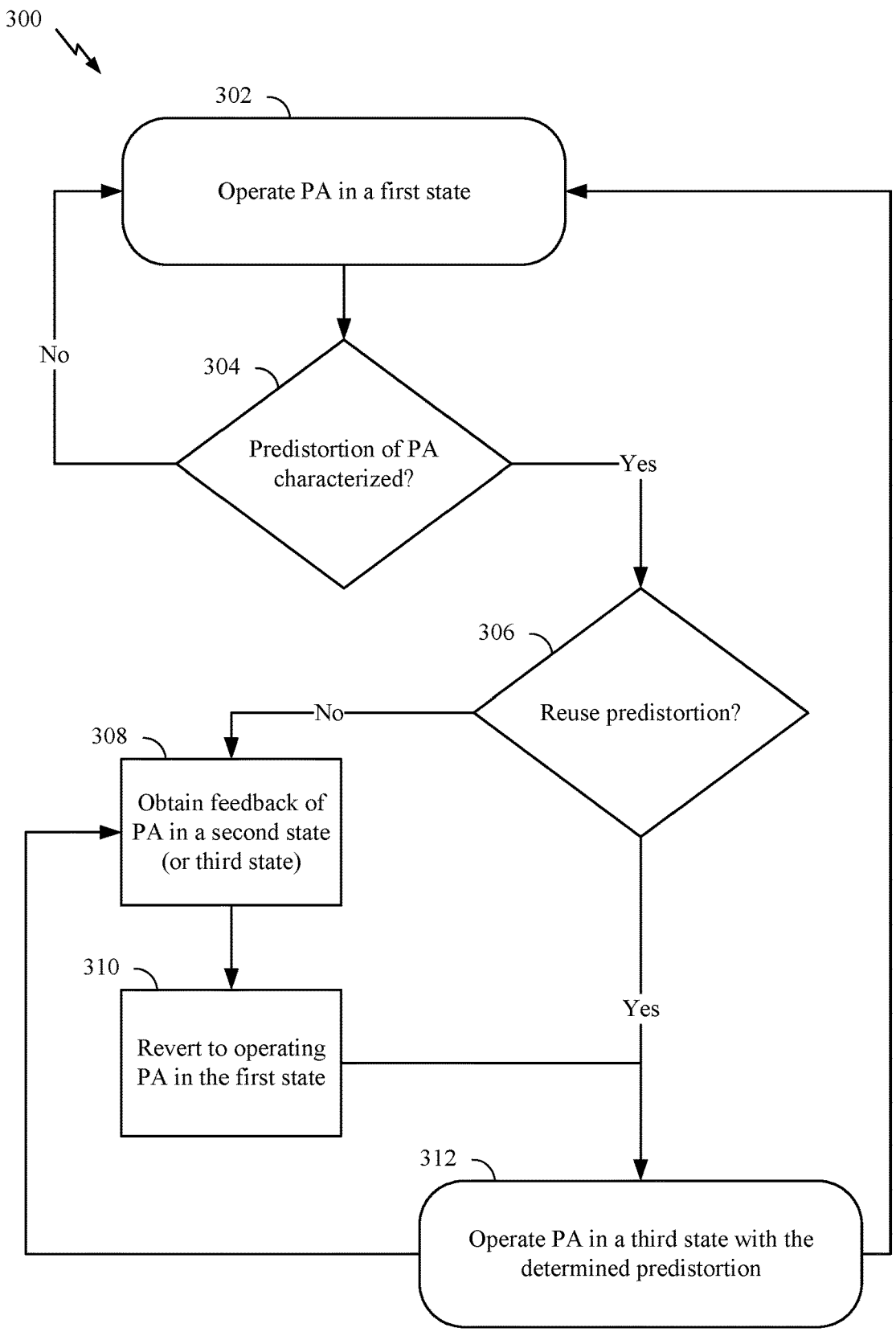
FIG. 3 is a flow diagram illustrating example operations for signal amplification.

FIG. 3 illustrates a flow diagram of example operations 300 for signal amplification. The operations 300 may be performed by signal amplification circuitry, such as the circuitry 200.

The operations 300 may optionally begin at block 302, where the circuitry may operate a power amplifier (e.g., the power amplifier 202) in a first state, where a bias voltage (e.g., the bias voltage 220) of the power amplifier is set to a first voltage based on a tracking mode (e.g., APT). For example, the power amplifier may amplify an input signal (e.g., the predistorted second input signal 214) for wireless transmission when the bias voltage is adjusted according to an APT mode.

At block 304, the circuitry may determine whether predistortion(s) associated with the power amplifier have been characterized for online calibration. If the predistortion(s) associated with the power amplifier have not been characterized for online calibration, the circuitry will continue to operate the power amplifier in the first state based on the tracking mode at block 302.

If the predistortion(s) associated with the power amplifier have been characterized for online calibration, then at block 306, the circuitry may determine whether to reuse a predistortion. For example, the circuitry may determine whether a previously determined predistortion (for example, from a previous online calibration) satisfies a certain reuse criterion or criteria. The circuitry may apply the previously determined predistortion when the output power of the power amplifier for the current transmission matches the output power for the previous transmission. The reuse criterion or criteria may consider various performance characteristics of the current transmission and the previous transmission, such as a change in the peak input power of the input signal to the power amplifier, the output power of the power amplifier, the compression point of the amplifier, the gain of the power amplifier, the bias voltage of the power amplifier, allocated signal bandwidth, frequency position of signal in transmission band, etc. In certain cases, the operations 300 may optionally begin at block 306.

If the predistortion will not be reused, the circuitry may determine the predistortion based on feedback associated with the power amplifier. At block 308, the circuitry may obtain feedback associated with the power amplifier in a second state where the bias voltage is set to a second voltage less than the first voltage. In certain aspects, the controller 206 may obtain samples of the second input signal 214 and/or the output signal 218 to determine a predistortion associated with the power amplifier. The feedback may include at least an output signal (e.g., the output signal 218) of the power amplifier. The feedback may also include an input signal (e.g., the first input signal 212) of the predistorter and/or an input signal (e.g., the second input signal 214) of the power amplifier. In some cases, the predistorter may refrain from applying a predistortion to the input signal (e.g., the first input signal 212) when the circuitry obtains the feedback at block 308. In certain cases, a predistortion may be applied to the input signal (e.g., the first input signal 212) when the circuitry obtains the feedback at block 308. For example, the controller 206 may obtain the feedback to retrain a particular predistortion with the predistortion applied to the input signal for a different bias voltage, peak input power, and/or output power. As an example, the circuitry may use a previously determined or available predistortion when obtaining the feedback associated with the power amplifier.

At block 310, the circuitry may revert to operating the power amplifier in the first state while the controller processes the feedback to determine the predistortion. For example, the power amplifier may amplify the input signal with the bias voltage set to the first voltage determined based on the tracking mode (e.g., APT).

At block 312, the circuitry may apply the predistortion to the input signal and operate the power amplifier in a third state where the bias voltage is set to a third voltage less than the first voltage. In some cases, the third voltage may be greater than the second voltage and less than the first voltage. The circuitry may operate the power amplifier in the third state with the predistortion at block 312 until a retraining event occurs or there is a change in transmit allocation. When the retraining event is detected, the circuitry may retrain the predistortion at block 308. A retraining event may include the expiration of a timer (e.g., 1000 millisecond timer) or a change in transmission conditions. The change in transmission conditions may include a change in operating temperature of the circuitry, peak input voltage of the power amplifier, bias voltage of the power amplifier, or output power of the power amplifier.

When a change in transmit allocation (and/or another event) is detected, the circuitry may return to operating the power amplifier in the first state at block 302, where the bias voltage is set according to the tracking mode (e.g., APT). A change in transmit allocation may include a change in transmit configuration including parameter(s) such as frequency resources, subcarrier spacing, bandwidth, modulation and coding scheme (MCS), transmit power, code rate, etc.

In some cases, the circuitry may perform the operations in block 302, block 304, and/or block 306 at a specific event. For example, the circuitry may perform the operations in block 302, block 304, and/or block 306 in response to an initial setup of a connection with a network entity (such as a base station) and/or a reconfiguration of a connection (e.g., a handover). The circuitry may perform the operations in block 302, block 304, and/or block 306 when the circuitry is initially powered on or when the circuitry reconnects to a wireless network. In such cases, a new transmit allocation or change in transmit allocation may trigger the circuitry to perform the operations in block 306 and/or block 308. In certain cases, the power amplifier may be operated in APT mode without predistortion in block 310.

In certain cases, a look-up table associated with the output power of the power amplifier may be used to amplify the input signal. For example, the look-up table may provide various gains, power levels, and bias voltages for different output powers of the power amplifier. The look-up table may include different values of the output power (e.g., Pout_1 and Pout_2 in Table 1) associated with at least one of the bias voltage, one or more gains applied to a transmit chain (e.g., the transmit path 102), and one or more power levels applied to the transmit chain. Table 1 is an example of a look-up table that may be used for setting various gains, power levels, and bias voltages based on the output power of the power amplifier. Table 1 includes a first output power (Pout_1) associated with a first transmit chain gain (G1), a first transmit chain power level (P1), and a first bias voltage (Vcc_1), and a second output power (Pout_2) associated with a second transmit chain gain (G2), a second transmit chain power level (P2), and a second bias voltage (Vcc_2).

TABLE 1

| Tx Chain Gain(s) | Tx Chain Power Level(s) | Bias Voltage ($V_{CC}$) | Output Power ($P_{out}$) |
|---|---|---|---|
| G1 | P1 | Vcc_1 | Pout_1 |
| G2 | P2 | Vcc_2 | Pout_2 |

In certain aspects, the second voltage and/or third voltage may be determined using one or more models of the bias voltage and peak input voltage of the power amplifier based on the output voltage of the power amplifier. For example, the second voltage and/or third voltage may be determined using a first model of the bias voltage with respect to the output voltage of the power amplifier and a second model of the peak input voltage of the power amplifier with respect to the output voltage. The first model may include a linear function of the bias voltage in terms of the output voltage, and the second model may include a polynomial function (e.g., a second-order function) of the peak input voltage in terms of the output voltage. The second voltage and/or third voltage may be determined to operate the power amplifier at a particular compression point, such as within a 0.25 dB compression point. Compression (or gain compression) occurs when the input power of an amplifier is increased to a level that reduces the gain of the amplifier and causes a nonlinear increase in output power. The compression point refers to the point at which the (ideal) linear output power and the non-linear (actual) output power of an amplifier differ by a certain amount, such as 1 dB for a 1 dB compression point or 0.25 dB for a 0.25 dB compression point.

Figure 4:
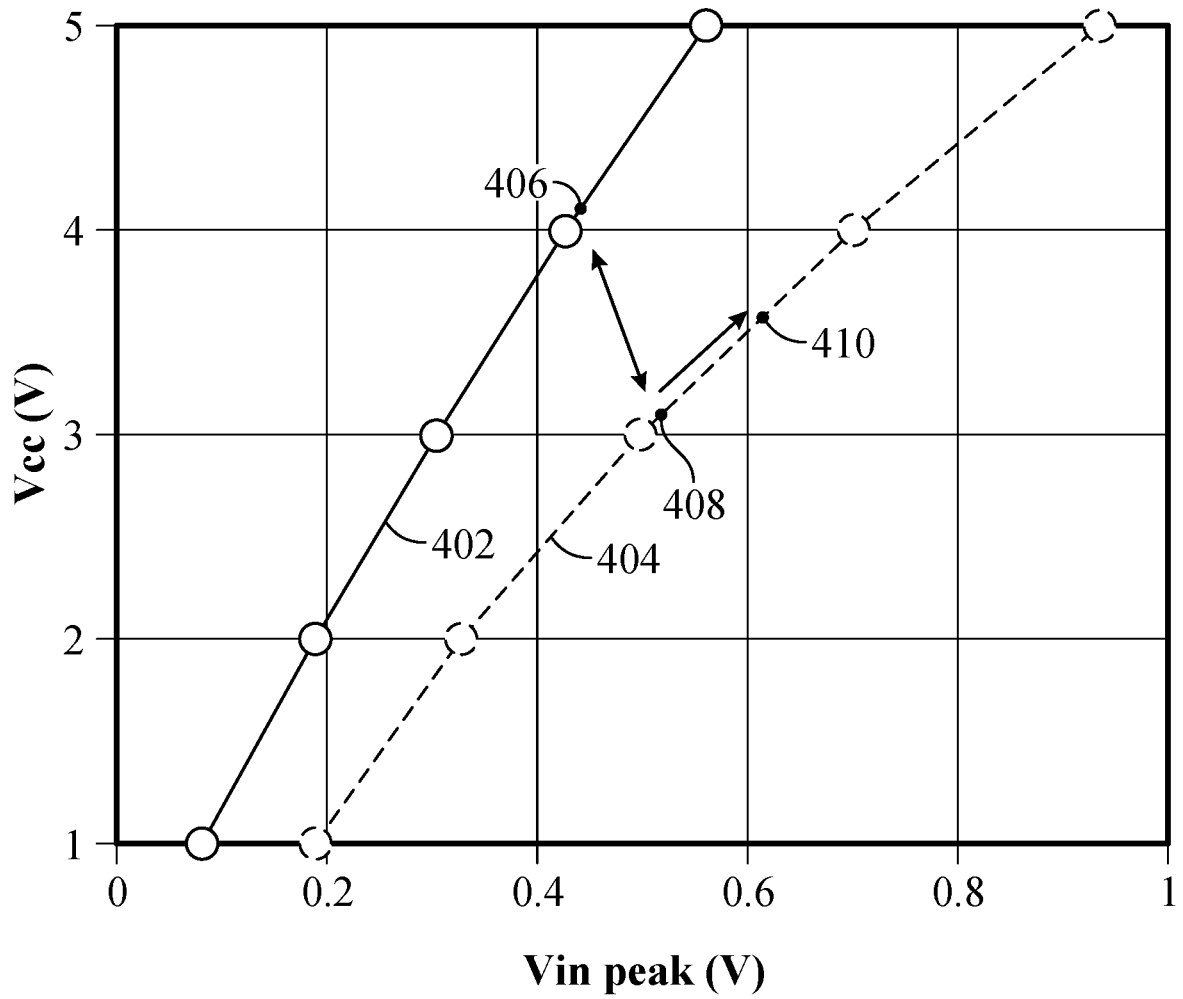
FIG. 4 is a graph illustrating an example of bias voltages ($V_{CC}$) versus peak input voltages ($V_{in}$) associated with a power amplifier.

FIG. 4 is a graph illustrating an example of bias voltages ($V_{CC}$) versus peak input voltages ($V_{in}$) associated with a power amplifier (e.g., the power amplifier 202) in terms of volts (V). The peak input voltage may be the peak voltage of the second input signal 214, for example. The first curve 402 may be representative of the bias voltages versus peak input voltage when the power amplifier is operated in an APT mode, and the second curve 404 may be representative of the bias voltages versus peak input voltage when the power amplifier is operated at a reduced voltage relative to the APT mode. For example, in response to the bias voltage being set to a first voltage 406 along the first curve 402 in the APT mode, the power amplifier may be operated with a bias voltage set to a second voltage 408 or set to a third voltage 410 along the second curve 404, as described herein.

In this example, the circuitry (e.g., the circuitry 200) may operate the power amplifier in a first state (e.g., at block 302 or block 310) where the bias voltage is set to a first voltage 406 according to a tracking mode (e.g., APT). While obtaining the feedback associated with the power amplifier (e.g., at block 308), the circuitry may operate the power amplifier in a second state where the bias voltage is set to a second voltage 408, which is less than the first voltage 406. While determining a predistortion associated with the power amplifier based on the feedback, the circuitry may operate the power amplifier in the first state where the bias voltage is set to the first voltage 406. In response to determining the predistortion (at block 312), the circuitry may apply the determined predistortion and operate the power amplifier in a third state where the bias voltage is set to a third voltage 410, which is less than the first voltage 406 and may be greater than the second voltage 408.

Figure 5:
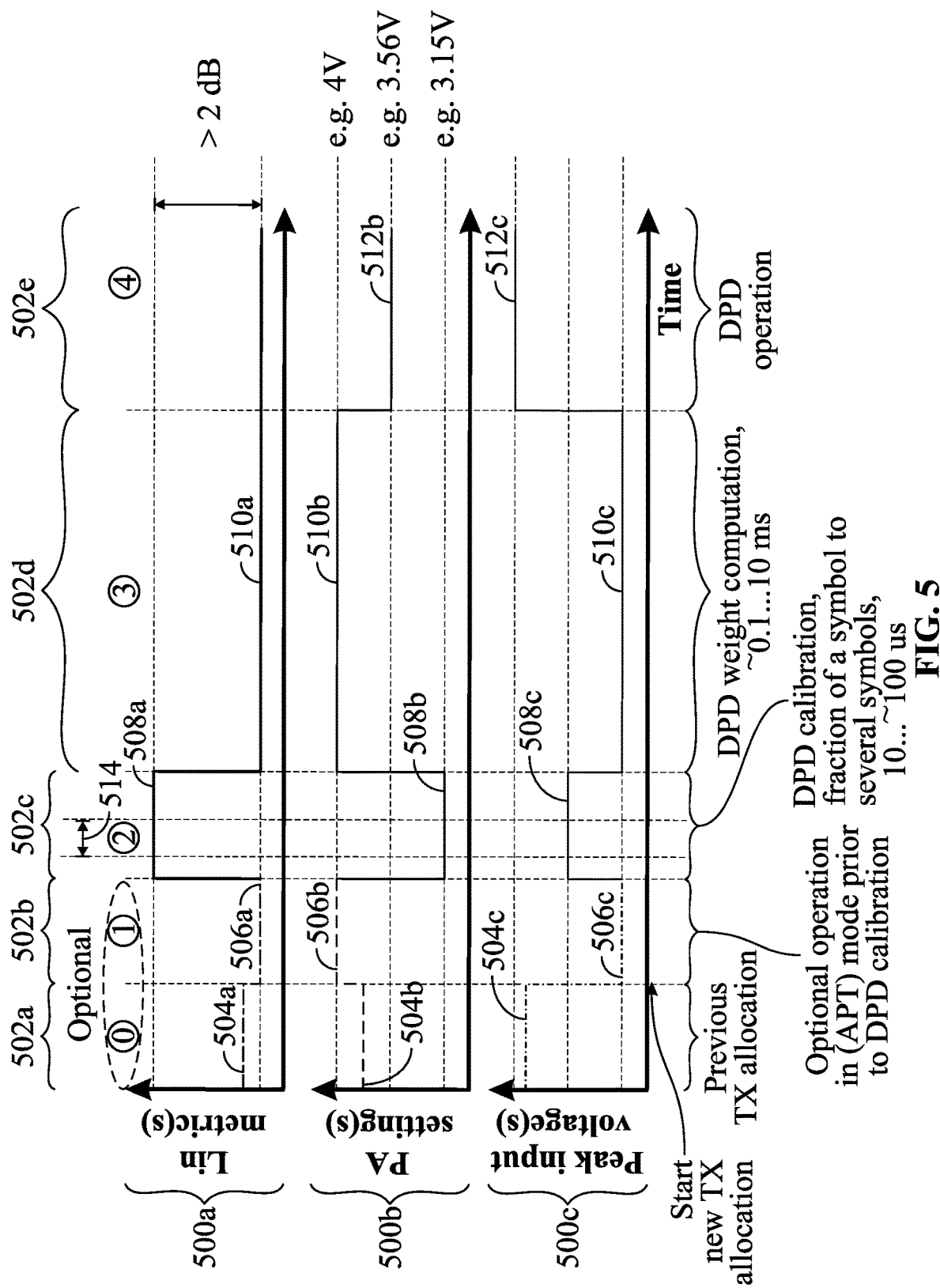
FIG. 5 includes graphs illustrating examples of linearity metric(s) over time, power amplifier settings (e.g., bias voltage ($V_{CC}$)) over time, and peak input voltages of the power amplifier over time, when predistortion is not applied during a feedback sampling phase.

FIG. 5 includes graphs 500a, 500b, 500c illustrating examples of linearity metric(s) over time, power amplifier setting(s) over time, and peak input voltages of the power amplifier over time, respectively, when predistortion is not applied during the feedback sampling phase (e.g., the third phase 502c). The linearity metric (labeled as "Lin metric(s)") in the graph 500a may be representative of the RF performance of the circuitry, such as ACLR, EVM, in-band emissions (IBE), intermodulation distortion (IMD), etc. The power amplifier setting(s) may be representative of certain settings (e.g., bias voltage) applied to various amplification circuitry in a transceiver, such as a power amplifier (PA), drive amplifier (DA), a pre-DA, a PA and an auxiliary PA (e.g., a Doherty amplifier), etc. The peak input voltages of the power amplifier may be representative of various voltages such as a peak input voltage (Vin), an envelope tracking voltage (Vet) associated with the input voltage, and/or an average voltage associated with the input voltage.

In this example, signal amplification circuitry (e.g., the circuitry 200) may be operated in five phases including a first phase 502a, a second phase 502b, a third phase 502c, a fourth phase 502d, and a fifth phase 502e. During the first phase 502a, the circuitry (e.g., the circuitry 200) may be transmitting using a previous transmit allocation, for example, at a specific transmit frequency, bandwidth, transmit power, MCS, etc. The peak input voltage applied to the power amplifier may be at a first input voltage 504c, and the bias voltage of the power amplifier may be set to a first bias voltage 504b. The circuitry may have a linearity metric (e.g., ACLR) at a first level 504a during the first phase 502a.

During the second phase 502b, the circuitry may operate the power amplifier in a first state (e.g., at block 302 and/or block 310) where the peak input voltage is applied at a second input voltage 506c, and the bias voltage is set to a second bias voltage 506b according to a tracking mode (e.g., APT). The circuitry may have a linearity metric at a second level 506a during the second phase 502b. In certain cases, the circuitry may start the second phase 502b in response to a new transmission allocation, such as an uplink grant or a semi-persistent uplink grant.

During the third phase 502c, the circuitry may obtain feedback associated with the power amplifier, where the feedback may include the output signal and/or input signal of the power amplifier. A capture or sampling occasion 514 may occur during the second phase 502b, where the capture occasion 514 may include the time period in which the feedback used for determining a predistortion is sampled at a controller. The circuitry may operate the power amplifier in a second state where the peak input voltage is applied at a third input voltage 508c, and the bias voltage is set to a third bias voltage 508b. The peak input voltage may be adjusted to be greater than the second input voltage 506c at the third input voltage 508c. The bias voltage may be adjusted to be less than the second bias voltage 506b at the third bias voltage 508b. The circuitry may also refrain from applying predistortion to the input signal of the power amplifier. In such cases, the circuitry may exhibit a linearity metric at a third level 508a, which is greater than the second level 506a. The third phase 502c may have a relatively short duration spanning a portion of a symbol to several symbols (e.g., 10 symbols), for example. In some cases, the third phase 502c may have a duration of 10 to 100 microseconds (μs).

During the fourth phase 502d, the circuitry may determine the predistortion based on the feedback. For example, the controller may compute weights for a polynomial model of the predistortion, such as a Volterra series, a generalized memory polynomial, or the like. While the predistortion is being determined (e.g., via online calibration), the circuitry may revert to operating the power amplifier in the first state where the bias voltage is set according to the tracking mode. For example, the bias voltage may be set to a fourth bias voltage 510b, which is greater than the third bias voltage 508b. The peak input voltage may be applied at a fourth input voltage 510c, which may be less than the third input voltage 508c. The circuitry may exhibit the linearity metric at a reduced level relative to that of the third phase 502c. During the fourth phase 502d, the linearity metric may be at a fourth level 510a, which is less than the third level 508a. The fourth phase 502d may have a duration of 0.1 to 10 milliseconds (ms).

In response to determining the predistortion, the circuitry may apply the predistortion to the input signal and operate the power amplifier at a reduced bias voltage with the predistorted input signal. For example, during the fifth phase 502e, the circuitry may operate the power amplifier in a third state where the bias voltage is set to a fifth bias voltage 512b, which is less than the second bias voltage 506b and/or the fourth bias voltage 510b. The circuitry may also exhibit the linearity metric at a reduced level relative to that of the third phase 502c. During the fifth phase 502e, the linearity metric may be at the third level 510a. As an example, the difference of the linearity in the third phase 502c and the other phases 502b, 502d, and 502e may be greater than or equal to 2 decibels (dB). The reduced bias voltage used during the fifth phase 502e may allow for reduced power consumption and improve efficiencies without factory calibration.

In certain cases, the circuitry may optionally operate in the first phase 502a and/or the second phase 502b before obtaining the feedback during the third phase 502c. In some cases, the circuitry may begin outputting the transmission with the new allocation at the third phase 502c without operating the power amplifier in the first state in the second phase 502b.

Figure 6:
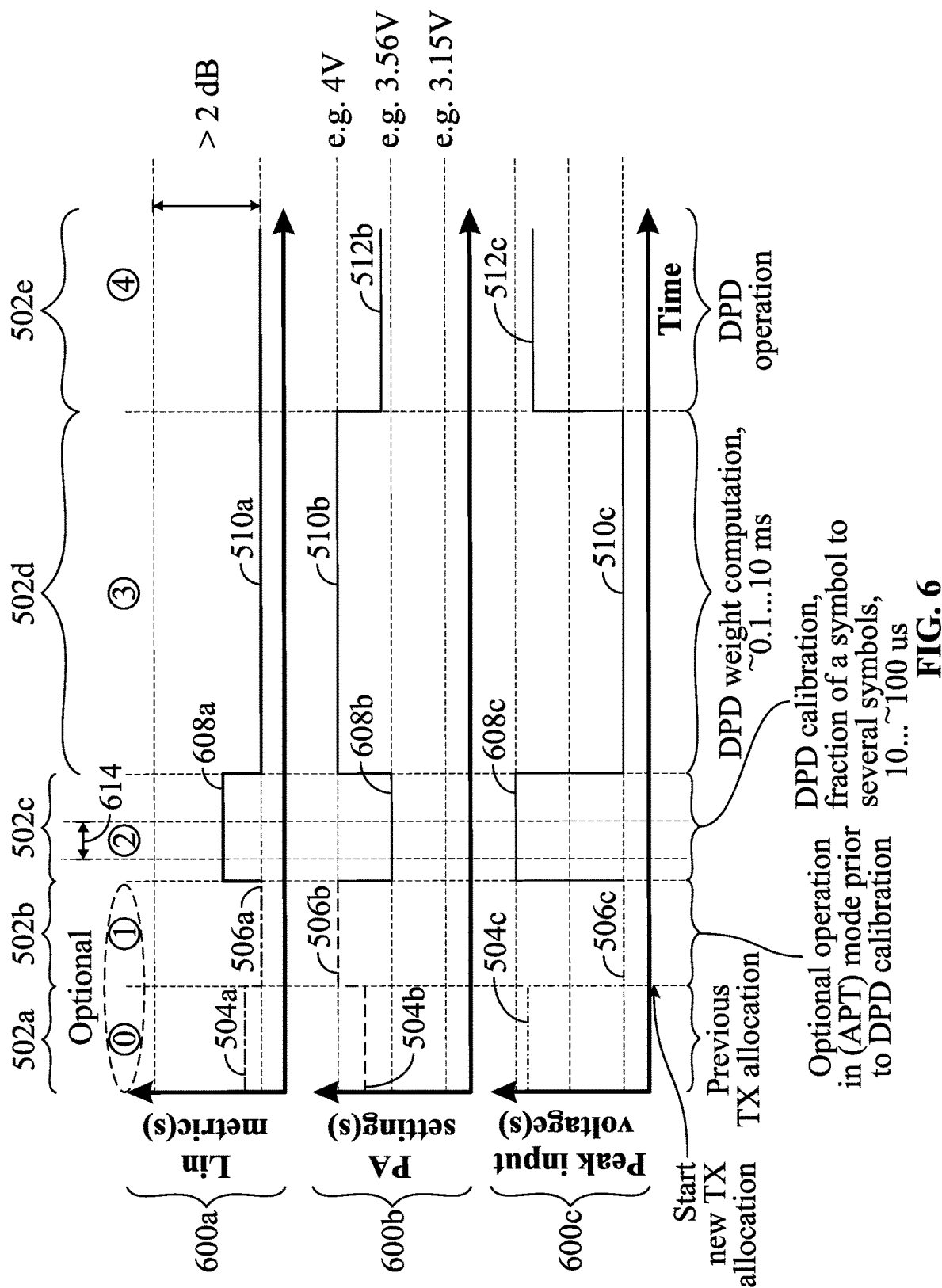
FIG. 6 includes graphs illustrating examples of linearity metric(s) over time, power amplifier settings (e.g., bias voltage ($V_{CC}$)) over time, and peak input voltages of the power amplifier over time, when predistortion is applied during the feedback sampling phase.

FIG. 6 includes graphs 600a, 600b, 600c illustrating examples of linearity metric(s) over time, power amplifier settings (e.g., bias voltage ($V_{CC}$)) over time, and peak input voltages of the power amplifier over time, respectively, when predistortion is applied during the feedback sampling phase.

In this example, the circuitry may apply predistortion to the input signal of the power amplifier during the third phase 502c. The circuitry may exhibit a linearity metric at a third level 608a, which is greater than the second level 506a, but less than the third level 508a when predistortion is not applied. During the third phase 502c, the circuitry may obtain feedback associated with the power amplifier, where the feedback may include the output signal and/or input signal of the power amplifier. The circuitry may obtain the feedback in the capture occasion 614. The circuitry may operate the power amplifier in the second state where the peak input voltage is applied at a third input voltage 608c, and the bias voltage is set to a third bias voltage 608b. The peak input voltage may be adjusted to be greater than the second input voltage 506c at the third input voltage 608c. The bias voltage may be adjusted to be less than the second bias voltage 506b at the third bias voltage 608b. During the first phase 502a, second phase 502b, fourth phase 502d, and fifth phase 502e, the circuitry may operate as described herein with respect to FIG. 5.

Figure 7:
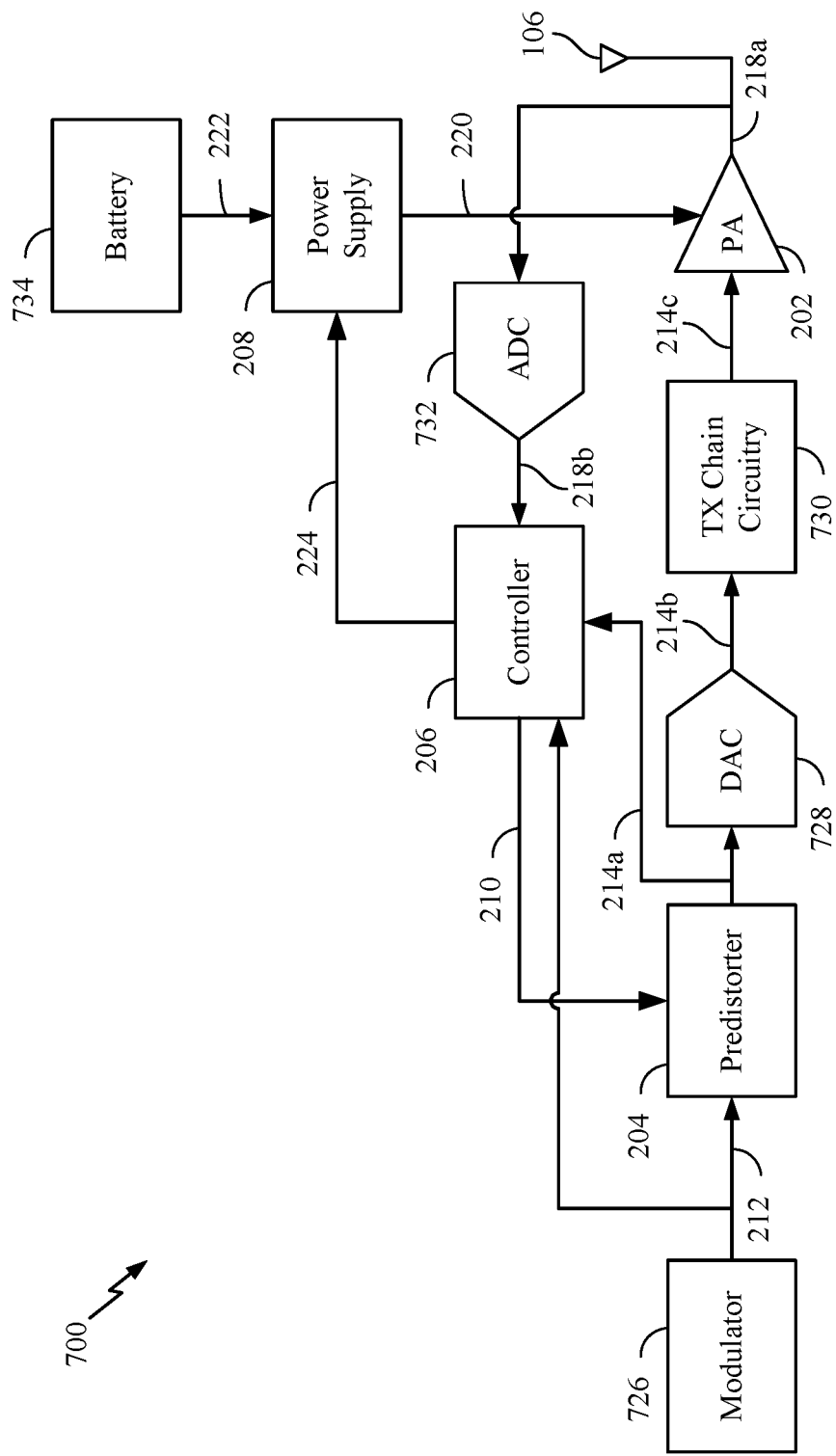
FIG. 7 is a block diagram illustrating example circuitry for signal amplification.

FIG. 7 is a block diagram illustrating example circuitry 700 for signal amplification. The circuitry 700 may be representative of the example circuitry 200 described herein with respect to FIG. 2. In certain aspects, the operations 300 may be performed by the circuitry 700. In addition to the elements described herein with respect to FIG. 2, the circuitry 700 may also include the antenna(s) 106, a modulator 726, a DAC 728, transmit (TX) chain circuitry 730, an ADC 732, and a battery 734. The battery 734 may be coupled to the power supply 208, where the battery may output the source voltage 222. The antenna(s) 106 may be coupled to the power amplifier 202, where the power amplifier 202 may output the output signal 218 for transmission via the antenna(s) 106.

The modulator 726 may be coupled to the predistorter 204, and the modulator 726 may generate the first input signal 212. The modulator 726 may perform digital modulation on a data stream. The modulator 726 may perform various digital processing on the data stream, such as scrambling, modulation (e.g., quadrature phase-shift keying (QPSK) or quadrature amplitude modulation (QAM)), layer mapping, and/or spatial processing (e.g., precoding). In some cases, the modulator 726 may encode the data stream across multiple carrier frequencies, for example, via orthogonal frequency-division multiplexing (OFDM). The modulator 726 may be implemented in or integrated with a modem.

The DAC 728 may be coupled to the predistorter 204 and coupled to the transmit chain circuitry 730. The DAC 728 may convert a digital version of the second input signal 214a to an analog version of the second input signal 214b.

As the analog conversion occurs after the predistortion in this example, the predistortion may be applied to a digital version of the first input signal 212. Digital predistortion (DPD) may be performed with the predistorter 204. The controller 206 may also obtain the digital version of the second input signal 214a and/or a digital version of the first input signal 212 for predistortion processing as described herein.

The transmit chain circuitry 730 may be coupled to the DAC 728 and coupled to the power amplifier 202. The transmit chain circuitry 730 may output an RF version of the second input signal 214c. The transmit chain circuitry 730 may include a BBF, a mixer, and a driver amplifier, for example, as described herein with respect to FIG. 1. The BBF may filter baseband signals from the analog version of the second input signal 214b. The mixer may upconvert the baseband frequency of the second input signal to a higher, RF frequency, and the driver amplifier may amplify the upconverted version of the second input signal. As described herein, the circuitry 700 may apply certain gains and/or certain power levels across the transmit chain circuitry depending on the target output power of the power amplifier 202 and/or bias voltage 220. For example, the circuitry 700 may apply one or more gains for the BBF, mixer, and/or driver amplifier based on the target output power of the power amplifier 202 and/or bias voltage 220. In certain aspects, the circuitry may use a look-up table (e.g., Table 1) to determine the gains and/or power levels applied to certain circuitry in the transmit chain.

The ADC 732 may be coupled to the power amplifier 202 and coupled to the controller 206. The ADC 732 may convert an analog version of the output signal 218a to a digital version of the output signal 218b. The ADC 732 may output the digital version of the output signal 218b to the controller 206 for predistortion processing described herein.

Figure 8:
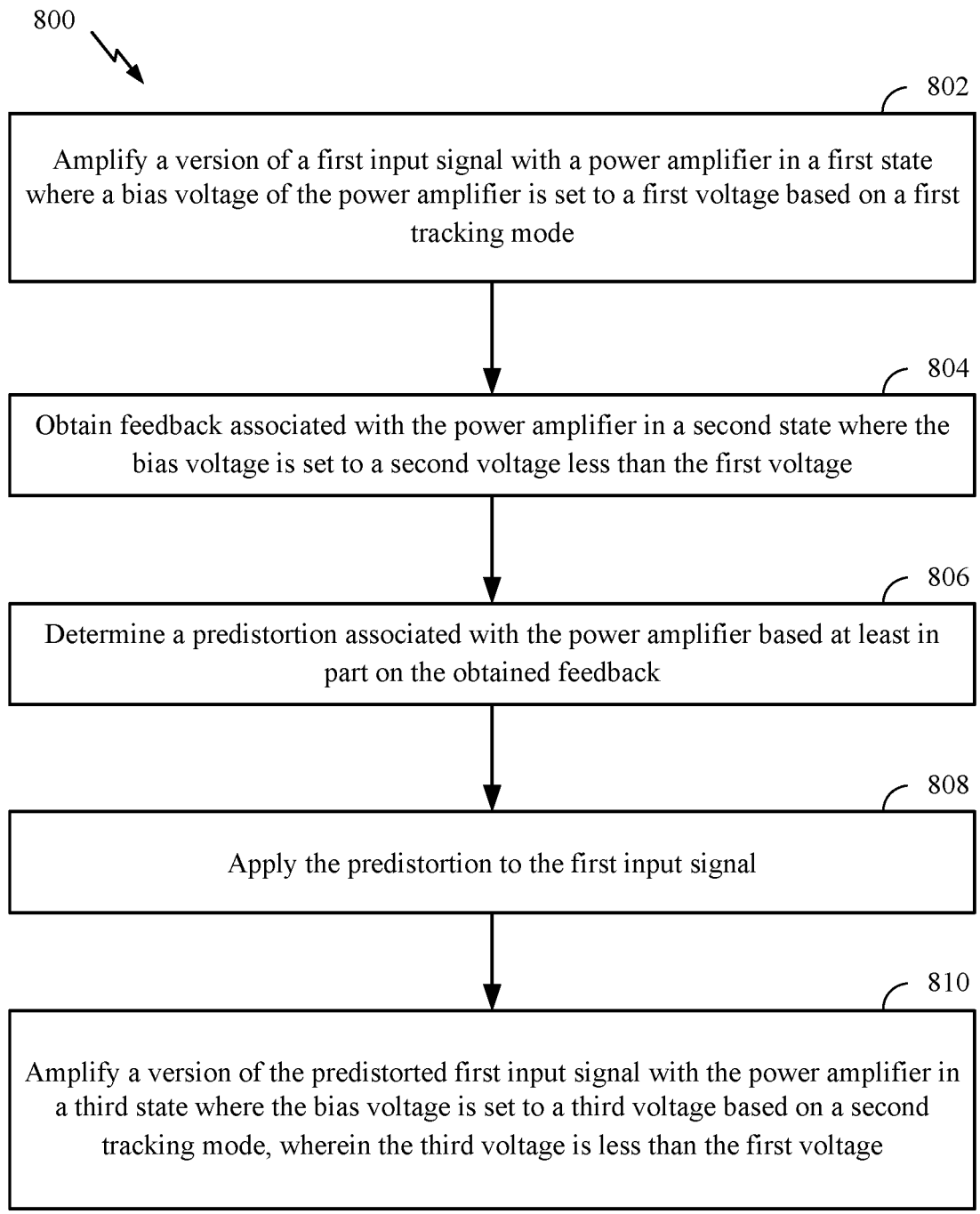
FIG. 8 is a flow diagram of example operations for signal amplification.

FIG. 8 is a flow diagram of example operations 800 for signal amplification. The operations 800 may be performed by signal amplification circuitry, such as the circuitry 200 or 700.

The operations 800 may optionally begin at block 802, where the circuitry may amplify a version (e.g., an analog version) of a first input signal (e.g., the second input signal 214) with a power amplifier (e.g., the power amplifier 202) in a first state where a bias voltage of the power amplifier is set to a first voltage (e.g., the first voltage 406) based on a first tracking mode (e.g., APT).

At block 804, the circuitry may obtain feedback associated with the power amplifier in a second state where the bias voltage is set to a second voltage (e.g., the second voltage 408) less than the first voltage. Obtaining the feedback may be referred to as performing a signal training capture, where the circuitry obtains samples of the input signal of the power amplifier, the input signal of the predistorter, and/or output signal of the power amplifier, for example. As used herein, the term "feedback associated with the power amplifier" may include information associated with the output of a transmit chain, where the information may include one or more gains associated with the transmit chain, one or more power levels associated with the transmit chain, a bias voltage, output power, output voltage, peak input voltage, etc. For example, the feedback may include a first output signal (e.g., the output signal 218) of the power amplifier, an input signal of a predistorter (e.g., the first input signal 212), and/or the first input signal. In certain cases, the circuitry may operate the power amplifier in the second state without predistortion of the first input signal, for example, for comprehensive online calibration of the predistortion. In some cases, the circuitry may operate the power amplifier in the second state with predistortion of the first input signal, for example, for retraining of the predistortion. In certain aspects, the circuitry may obtain the feedback associated with the power amplifier in a capture occasion, for example, during the third phase 502c in connection with FIGS. 5 and 6. The capture occasion may include a portion of a symbol or one or more symbols, for example, a fraction of a symbol to ten symbols.

At block 806, the circuitry may determine a predistortion associated with the power amplifier based at least in part on the obtained feedback. In certain aspects, while determining the predistortion, the circuitry may revert to operating the power amplifier in the first state. For example, the circuitry may amplify the version of the first input signal with the power amplifier in the first state while determining the predistortion. In some cases, the circuitry may apply a default predistortion while operating the power amplifier in the first state. As described herein with respect to FIGS. 5 and 6, reverting to operating the power amplifier in the first state may allow the circuitry to operate with a suitable ACLR while the circuitry determines the predistortion. The circuitry may determine the predistortion associated with the power amplifier.

At block 808, the circuitry may apply the predistortion to the first input signal. In some cases, the circuitry may apply the predistortion to the first input signal as a digital predistortion.

At block 810, the circuitry may amplify a version (e.g., an analog version) of the predistorted first input signal with the power amplifier in a third state where the bias voltage is set to a third voltage (e.g., the third voltage 410) based on a second tracking mode (e.g., APT). The third voltage may be less than the first voltage, and in some cases, the third voltage may be greater than the second voltage. In response to determining the predistortion, the circuitry may apply the predistortion to the first input signal at block 808 and amplify the predistorted first input signal with the power amplifier at block 810, for example, during the fifth phase 502e as described herein with respect to FIGS. 5 and 6. The reduced bias voltage used at block 810 may allow for reduced power consumption and improve efficiencies without factory calibration of the predistortion.

In certain aspects, the voltages for the second and third states may be determined such that the voltage levels allow for the circuitry to satisfy certain performance metric(s). In certain cases, the circuitry may operate the power amplifier in the second state and the third state at a compression point that satisfies a threshold (e.g., a threshold within 0.25 dB compression point or within 0.25 dB difference). That is, a compression point associated with the power amplifier in the second state and the third state may satisfy the threshold. The amount of compression in the signal peaks, referred to as the compression point (CP), may be the same or within a certain threshold in the signal training capture (e.g., at block 804) compared to the signal amplification in the third state (e.g., at block 810). The compression may be within a 0.25 dB difference between the capture and the reduced bias voltage operation (e.g., at block 810).

In some cases, operating the power amplifier in the second state and the third state may satisfy a metric associated with an output power of the power amplifier. The circuitry may maintain the transmit power (e.g., the output power of the power amplifier) within a threshold from a target transmit power. For example, the transmit power may be kept within +/−0.5 dB from a target transmit power, during the predistortion training (e.g., at block 804 and/or block 806) and the signal amplification in the third state (e.g., at block 810). In certain aspects, the metric comprises at least one of a change in the output power (e.g., ΔPout) with respect to the output power during the first state, a first difference of the output power during the second state and a target output power of the power amplifier, and a second difference of the output power during the third state and the target output power. For certain aspects, the second state and the third state of the power amplifier may satisfy the metric associated with an output power of the power amplifier when the output power during the second state and the third state is within a range of powers (e.g., +/−0.5 dB) from a target output power of the power amplifier.

In certain aspects, the circuitry may determine the second voltage and/or third voltage using one or more models of the bias voltage and peak input voltage of the power amplifier based on the output voltage of the power amplifier, for example, as described herein in connection with FIG. 3. In particular, the circuitry may determine the second voltage and/or third voltage using the one or more models without iterating through multiple test voltages for the bias voltage to determine a voltage that satisfies a certain metric. In some cases, the circuitry may apply the predistortion to the first signal after a single iteration of the obtaining at block 804 and the determining at block 806. The single iteration may refer to performing the online predistortion calibration/characterization with the bias voltage only set to the second voltage at block 804 and the bias voltage only set to the third voltage at block 810 without multiple iterations of adjusted voltages for the bias voltage. In certain cases, the circuitry may obtain the first output signal of the power amplifier in the second state where the bias voltage is only set to the second voltage for a particular duration (e.g., the duration of the capture occasion). The circuitry may amplify the version of the predistorted first input signal with the power amplifier in the third state where the bias voltage is only set to the third voltage for a particular duration (e.g., 1000 ms) or in response to an event (e.g., a change in operating conditions). For example, the second voltage and/or the third voltage may be a single, constant voltage without multiple test voltages.

For certain aspects, the tracking mode for the bias voltage may include an APT mode. For example, at least one of the first tracking mode or the second tracking mode comprises an average power tracking mode.

In certain aspects, amplification of the input signal may be performed based on a look-up table (e.g., Table 1) associated with the output power of the power amplifier. For example, the circuitry may amplify the version of the first input signal based at least in part on a value stored in a look-up table associated with an output power of the power amplifier. The look-up table may include different values of the output power associated with at least one of the bias voltage, one or more gains applied to a transmit chain, and one or more power levels applied to the transmit chain. In some cases, the bias voltage may be determined according to an entry or value in the look-up table, and the bias voltage may be used to power the amplifier amplifying the input signal, for example, at block 802.

For certain aspects, the circuitry may retrain (e.g., recalibrate, re-characterize, or re-determine) a predistortion, such as the predistortion determined at block 806. The circuitry may re-determine the predistortion in response to one or more criteria being satisfied (e.g., when a timer expires or a characteristic associated with the power amplifier changes). The circuitry may obtain additional feedback associated with the power amplifier in the second state or in the third state in response to the one or more criteria being satisfied. The additional feedback may include a second output signal of the power amplifier and/or a second input signal of the power amplifier, where the second output signal and/or second input signal may be different signals in time with respect to the first input signal and first output signal. The circuitry may determine the predistortion associated with the power amplifier based at least in part on the additional feedback, where the predistortion may be updated compared to the predistortion determined at block 806.

The one or more criteria may be satisfied when a timer expires or a characteristic associated with the power amplifier changes by a threshold. The timer may run from when the previous predistortion was determined, and expiration of the timer may indicate to retrain the predistortion (e.g., after 1000 milliseconds from when the previous predistortion was determined). The circuitry may retrain the predistortion in response to various changes in characteristics associated with the power amplifier, such as a change in operating temperature (e.g., temperature bin changes), frequency (e.g., a change in carrier frequency), modulation scheme (e.g., a change from QPSK to QAM or vice versa), output (e.g., transmit) power, etc. A temperature bin may refer to a particular temperature range, where a change in temperature bin may indicate a particular change in temperature.

In certain aspects, the circuitry may reuse the predistortion determined at block 808, for example, for other transmission allocation(s), bias voltage(s), peak input voltage(s), output power(s), etc. For instance, the circuitry may reuse the predistortion for a new power target (e.g., a different transmit power). The circuitry may apply the predistortion to a second input signal in response to one or more criteria for reusing the predistortion being satisfied, and the circuitry may amplify a version of the predistorted second input signal with the power amplifier in the third state or in a fourth state where the bias voltage is set to a fourth voltage. That is, the circuitry may reuse the predistortion determined at block 808 in response to a certain criterion or certain criteria being satisfied, for example, when a new or different transmission allocation, a different bias voltage, a different peak input voltage, and/or a different output power. The fourth voltage may be associated with a different APT voltage than the first voltage, for example, as described herein with respect to FIG. 4. The one or more criteria for reusing the predistortion may include various changes in characteristics associated with the power amplifier and/or transmission allocation. For example, the one or more criteria for reusing the predistortion may be satisfied when a difference of a first output power associated with the first input signal and a second output power associated with the second input signal is within a threshold (e.g., 0.5 dB).

In certain aspects, the operations 800 may start at block 804 without an initial transmission in the first state. The circuitry may obtain the feedback at block 804, determine the predistortion while operating the power amplifier in the first state at block 806, apply the predistortion at block 808, and amplify the signal with the power amplifier in the third state at block 810. For example, the predistortion characterization capture at block 804 may begin at the start of a new transmission. In such cases, the first state may be a logical state determined by the circuitry for implementing the second state and third state.

Example Wireless Communications Network

Figure 9:
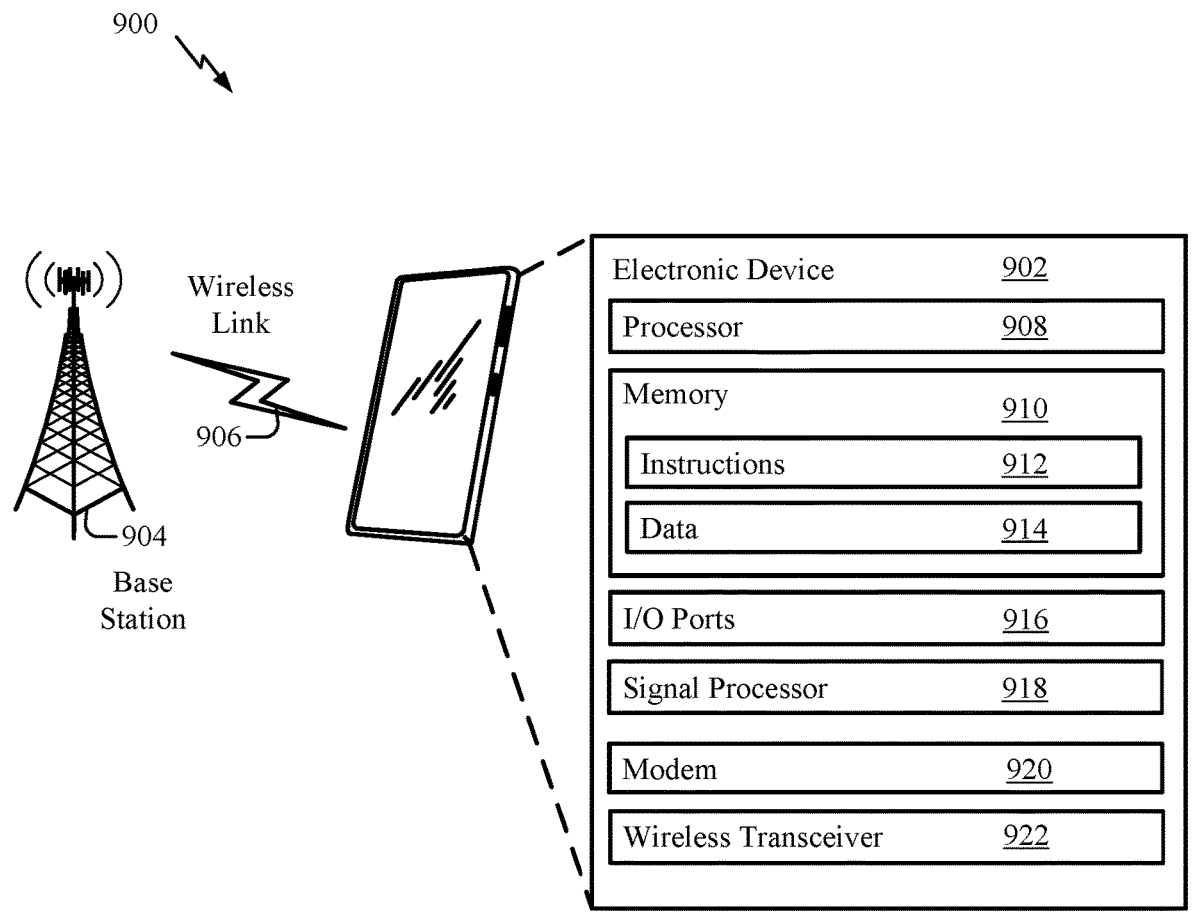
FIG. 9 is a diagram of a wireless communication network that includes a wireless communication device with signal amplification circuitry.

In certain aspects, the signal amplification circuitry and/or method may be used in certain wireless communication devices in a wireless network. FIG. 9 is a diagram of a wireless communication network 900 that includes a wireless communication device 902, which has a wireless transceiver 996 such as the RF transceiver 100 of FIG. 1. In certain aspects, the wireless transceiver 996 may include signal amplification circuitry such as the circuitry 200 or 700.

In the wireless communication network 900, the wireless communication device 902 communicates with a base station 904 through a wireless link 906. As shown, the wireless communication device 902 is depicted as a smart phone. However, the wireless communication device 902 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 904 communicates with the wireless communication device 902 via the wireless link 906, which may be implemented as any suitable type of wireless link. Although depicted as a base station tower of a cellular radio network, the base station 904 may represent or be implemented as another device, such as a satellite, terrestrial broadcast tower, access point, peer-to-peer device, mesh network node, fiber optic line, another electronic device generally as described above, and so forth. Hence, the wireless communication device 902 may communicate with the base station 904 or another device via a wired connection, a wireless connection, or a combination thereof. The wireless link 906 can include a downlink of data or control information communicated from the base station 904 to the wireless communication device 902 and an uplink of other data or control information communicated from the wireless communication device 902 to the base station 904. The wireless link 906 may be implemented using any suitable communication protocol or standard, such as 3rd Generation Partnership Project Long-Term Evolution (3GPP LTE), 3GPP New Radio Fifth Generation (NR 5G), IEEE 802.11 (WiFi), IEEE 802.16 (WiMAX), Bluetooth™, and so forth.

The wireless communication device 902 includes a processor 908 and a memory 910. The memory 910 may be or form a portion of a computer-readable storage medium. The processor 908 may include any type of processor, such as an application processor or a multi-core processor, that is configured to execute processor-executable instructions (e.g., code) stored by the memory 910. The memory 910 is configured to store instructions (e.g., computer-executable code) that when executed by the processor 908, cause the processor 908 to perform the operations 300 and/or the operations 800 described with respect to FIG. 3 and FIG. 8, or any aspect related to such operations. The memory 910 may include any suitable type of data storage media, such as volatile memory (e.g., random access memory (RAM)), non-volatile memory (e.g., flash memory), optical media, magnetic media (e.g., disk or tape), and so forth. In the context of this disclosure, the memory 910 is implemented to store instructions 912, data 914, and other information of the wireless communication device 902, and thus when configured as or part of a computer-readable storage medium, the memory 910 does not include transitory propagating signals or carrier waves. That is, the memory 910 may include non-transitory computer-readable media (e.g., tangible media).

The wireless communication device 902 may also include input/output ports 916. The I/O ports 916 enable data exchanges or interaction with other devices, networks, or users or between components of the device.

The wireless communication device 902 may further include a signal processor (SP) 918 (e.g., such as a digital signal processor (DSP)). The signal processor 918 may function similar to the processor 908 and may be capable of executing instructions and/or processing information in conjunction with the memory 910.

For communication purposes, the wireless communication device 902 also includes a modem 920, a wireless transceiver 922, and an antenna (not shown). The wireless transceiver 922 provides connectivity to respective networks and other wireless communication devices connected therewith using radio-frequency (RF) wireless signals and may include the RF transceiver 100 of FIG. 1 and/or the signal amplification circuitry 200 or 700 of FIGS. 2 and 7. The wireless transceiver 922 may facilitate communication over any suitable type of wireless network, such as a wireless local area network (WLAN), a peer-to-peer (P2P) network, a mesh network, a cellular network, a wireless wide area network (WWAN), a navigational network (e.g., the global positioning system (GPS) of North America or another global navigation satellite system (GNSS)), and/or a wireless personal area network (WPAN).

The various operations of methods described above may be performed by any suitable means capable of performing the corresponding functions. The means may include various hardware and/or software component(s) and/or module(s), including, but not limited to a circuit, an application specific integrated circuit (ASIC), or processor. For example, means for amplifying may include a power amplifier (e.g., the power amplifier 202). Means for obtaining feedback and/or determining a predistortion may include a controller or processor (e.g., the controller 206). Means for applying a predistortion may include a processor and/or a predistorter (e.g., the predistorter 204).

Based on the present disclosure, it should be appreciated that the signal amplification circuitry and the method of signal amplification described herein provide various advantages. The signal amplification circuitry and the method of signal amplification described herein allow increased power efficiency and decreased power consumption, for example, by operating a power amplifier at a lower bias voltage. The online feedback and calibration may enable operating a power amplifier at a lower bias voltage without factory calibration for predistortion, which will be desirable to wireless device manufacturers. The predistortion may allow for desirable power amplifier performance, such as a certain linearity, a low adjacent channel leakage ratio (ACLR), and/or a low error vector magnitude (EVM).

Example Aspects

In addition to the various aspects described above, specific combinations of aspects are within the scope of the disclosure, some of which are detailed below:

Aspect 1: A method of signal amplification, comprising: amplifying a version of a first input signal with a power amplifier in a first state where a bias voltage of the power amplifier is set to a first voltage based on a first tracking mode; obtaining a first output signal of the power amplifier in a second state where the bias voltage is set to a second voltage less than the first voltage; determining a predistortion associated with the power amplifier based at least in part on the obtained first output signal; applying the predistortion to the first input signal; and amplifying a version of the predistorted first input signal with the power amplifier in a third state where the bias voltage is set to a third voltage based on a second tracking mode, wherein the third voltage is less than the first voltage.

Aspect 2: The method of Aspect 1, wherein a compression point associated with the power amplifier in the second state and the third state satisfies a threshold.

Aspect 3: The method of Aspect 1 or 2, wherein applying the predistortion to the first input signal comprises applying the predistortion to the first signal after a single iteration of the obtaining and the determining.

Aspect 4: The method according to any of Aspects 1-3, wherein: obtaining the first output signal comprises obtaining the first output signal of the power amplifier in the second state where the bias voltage is only set to the second voltage; and amplifying the version of the predistorted first input signal comprises amplifying the version of the predistorted first input signal with the power amplifier in the third state where the bias voltage is only set to the third voltage.

Aspect 5: The method according to any of Aspects 1-4, wherein at least one of the first tracking mode or the second tracking mode comprises an average power tracking mode.

Aspect 6: The method according to any of Aspects 1-5, wherein amplifying the version of the first input signal comprises amplifying the version of the first input signal based at least in part on a look-up table associated with an output power of the power amplifier.

Aspect 7: The method of Aspect 6, wherein the look-up table comprises different values of the output power associated with at least one of the bias voltage, one or more gains applied to a transmit chain, and one or more power levels applied to the transmit chain.

Aspect 8: The method according to any of Aspects 1-7, wherein determining the predistortion comprises amplifying the version of the first input signal with the power amplifier in the first state while determining the predistortion.

Aspect 9: The method according to any of Aspects 1-8, wherein obtaining the first output signal of the power amplifier comprises obtaining the first output signal of the power amplifier in a capture occasion.

Aspect 10: The method of Aspect 9, wherein the capture occasion comprises a fraction of a symbol to ten symbols.

Aspect 11: The method according to any of Aspects 1-10, wherein the second state and the third state of the power amplifier satisfy a metric associated with an output power of the power amplifier.

Aspect 12: The method of Aspect 11, wherein the metric comprises at least one of a change in the output power with respect to the output power during the first state, a first difference of the output power during the second state and a target output power of the power amplifier, and a second difference of the output power during the third state and the target output power.

Aspect 13: The method of Aspect 11 or 12, wherein the second state and the third state of the power amplifier satisfy the metric associated with the output power of the power amplifier when the output power during the second state and the third state is within a range of powers from a target output power of the power amplifier.

Aspect 14: The method according to any of Aspects 1-13, further comprising: obtaining a second output signal of the power amplifier in the second state or the third state in response to one or more criteria being satisfied.

Aspect 15: The method of Aspect 14, wherein the one or more criteria is satisfied when a timer expires or a characteristic associated with the power amplifier changes by a threshold.

Aspect 16: The method according to any of Aspects 1-15, further comprising: applying the predistortion to a second input signal in response to one or more criteria being satisfied; and amplifying a version of the predistorted second input signal with the power amplifier in the third state or in a fourth state where the bias voltage is set to a fourth voltage.

Aspect 17: The method of Aspect 16, wherein the one or more criteria are satisfied when a difference of a first output power associated with the first input signal and a second output power associated with the second input signal is within a threshold.

Aspect 18: The method according to any of Aspects 1-17, wherein applying the predistortion comprises applying the predistortion to the first input signal as a digital predistortion.

Aspect 19: A method of signal amplification, comprising: obtaining a first output signal of a power amplifier in a first state where a bias voltage is set to a first voltage less than a second voltage determined based on a first tracking mode; determining a predistortion associated with the power amplifier based at least in part on the obtained first output signal; applying the predistortion to a first input signal of the power amplifier; and amplifying a version of the predistorted first input signal with the power amplifier in a second state where the bias voltage is set to a third voltage based on a second tracking mode, wherein the third voltage is less than the first voltage.

Aspect 20: The method of Aspect 19, wherein determining the predistortion comprises amplifying the version of the first input signal with the power amplifier in the third state where the bias voltage is set to the second voltage while determining the predistortion.

Aspect 21: An apparatus for signal amplification, comprising: a power amplifier; a power supply coupled to the power amplifier; a memory comprising executable instructions; and a controller coupled to the memory, to the power amplifier, and to the power supply, wherein the controller is configured to execute the executable instructions and cause the apparatus to: amplify a version of a first input signal with the power amplifier in a first state where a bias voltage of the power amplifier is set to a first voltage with the power supply based on a first tracking mode, obtain a first output signal of the power amplifier in a second state where the bias voltage is set to a second voltage with the power supply, wherein the second voltage is less than the first voltage, determine a predistortion associated with the power amplifier based at least in part on the obtained first output signal, apply the predistortion to the first input signal, and amplify a version of the predistorted first input signal with the power amplifier in a third state where the bias voltage is set to a third voltage with the power supply based on a second tracking mode, wherein the third voltage is less than the first voltage.

Aspect 22: The apparatus of Aspect 21, wherein a compression point associated with the power amplifier in the second state and the third state satisfies a threshold.

Aspect 23: The apparatus of Aspect 21 or 22, wherein to apply the predistortion to the first input signal, the controller is further configured to execute the executable instructions and cause the apparatus to apply the predistortion to the first signal after a single iteration of the obtaining and the determining.

Aspect 24: The apparatus according to any of Aspects 21-23, wherein: to obtain the first output signal, the controller is further configured to execute the executable instructions and cause the apparatus to obtain the first output signal of the power amplifier in the second state where the bias voltage is only set to the second voltage; and to amplify the version of the predistorted first input signal, the controller is further configured to execute the executable instructions and cause the apparatus to amplify the version of the predistorted first input signal with the power amplifier in the third state where the bias voltage is only set to the third voltage.

Aspect 25: The apparatus according to any of Aspects 21-24, wherein at least one of the first tracking mode or the second tracking mode comprises an average power tracking mode.

Aspect 26: The apparatus according to any of Aspects 21-25, wherein to amplify the version of the first input signal, the controller is further configured to execute the executable instructions and cause the apparatus to amplify the version of the first input signal based at least in part on a look-up table associated with an output power of the power amplifier.

Aspect 27: The apparatus according to any of Aspects 21-26, wherein to determine the predistortion, the controller is further configured to execute the executable instructions and cause the apparatus to amplify the version of the first input signal with the power amplifier in the first state while determining the predistortion.

Aspect 28: The apparatus according to any of Aspects 21-27, wherein the second state and the third state of the power amplifier satisfy a metric associated with an output power of the power amplifier.

Aspect 29: The apparatus according to any of Aspects 21-28, wherein the controller is further configured to execute the executable instructions and cause the apparatus to obtain a second output signal of the power amplifier in the second state or the third state in response to one or more criteria being satisfied.

Aspect 30: An apparatus for signal amplification, comprising: a power amplifier; a power supply coupled to the power amplifier; a memory comprising executable instructions; and a controller coupled to the memory, to the power amplifier, and to the power supply, wherein the controller is configured to execute the executable instructions and cause the apparatus to: obtain a first output signal of a power amplifier in a first state where a bias voltage is set to a first voltage less than a second voltage determined based on a first tracking mode, determine a predistortion associated with the power amplifier based at least in part on the obtained first output signal, apply the predistortion to a first input signal of the power amplifier, and amplify a version of the predistorted first input signal with the power amplifier in a second state where the bias voltage is set to a third voltage based on a second tracking mode, wherein the third voltage is less than the first voltage.

Aspect 31: An apparatus, comprising: a memory comprising computer-executable instructions; one or more processors configured to execute the computer-executable instructions and cause the processing system to perform a method in accordance with any of Aspects 1-20.

Aspect 32: An apparatus, comprising means for performing a method in accordance with any of Aspects 1-20.

Aspect 33: A non-transitory computer-readable medium comprising computer-executable instructions that, when executed by one or more processors of a processing system, cause the processing system to perform a method in accordance with any of Aspects 1-20.

Aspect 34: A computer program product embodied on a computer-readable storage medium comprising code for performing a method in accordance with any of Aspects 1-20.

ADDITIONAL CONSIDERATIONS

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, a signal may refer to a detectable physical quantity or impulse (such as a voltage, current, or magnetic field strength over time) by which messages or information can be transmitted. A signal may carry information available for observation.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

The invention claimed is:

1. A method of signal amplification, comprising:
amplifying a version of a first input signal with a power amplifier in a first state where a bias voltage of the power amplifier is set to a first voltage based on a first tracking mode;

obtaining a first output signal of the power amplifier in a second state where the bias voltage is set to a second voltage less than the first voltage;
determining a predistortion associated with the power amplifier based at least in part on the obtained first output signal;
applying the predistortion to the first input signal; and
amplifying a version of the predistorted first input signal with the power amplifier in a third state where the bias voltage is set to a third voltage based on a second tracking mode, wherein the third voltage is less than the first voltage.

2. The method of claim 1, wherein a compression point associated with the power amplifier in the second state and the third state satisfies a threshold.

3. The method of claim 1, wherein applying the predistortion to the first input signal comprises applying the predistortion to the first signal after a single iteration of the obtaining and the determining.

4. The method of claim 1, wherein:
obtaining the first output signal comprises obtaining the first output signal of the power amplifier in the second state where the bias voltage is only set to the second voltage; and
amplifying the version of the predistorted first input signal comprises amplifying the version of the predistorted first input signal with the power amplifier in the third state where the bias voltage is only set to the third voltage.

5. The method of claim 1, wherein at least one of the first tracking mode or the second tracking mode comprises an average power tracking mode.

6. The method of claim 1, wherein amplifying the version of the first input signal comprises amplifying the version of the first input signal based at least in part on a look-up table associated with an output power of the power amplifier.

7. The method of claim 6, wherein the look-up table comprises different values of the output power associated with at least one of the bias voltage, one or more gains applied to a transmit chain, and one or more power levels applied to the transmit chain.

8. The method of claim 1, wherein determining the predistortion comprises amplifying the version of the first input signal with the power amplifier in the first state while determining the predistortion.

9. The method of claim 1, wherein obtaining the first output signal of the power amplifier comprises obtaining the first output signal of the power amplifier in a capture occasion.

10. The method of claim 9, wherein the capture occasion comprises a fraction of a symbol to ten symbols.

11. The method of claim 1, wherein the second state and the third state of the power amplifier satisfy a metric associated with an output power of the power amplifier.

12. The method of claim 11, wherein the metric comprises at least one of a change in the output power with respect to the output power during the first state, a first difference of the output power during the second state and a target output power of the power amplifier, and a second difference of the output power during the third state and the target output power.

13. The method of claim 11, wherein the second state and the third state of the power amplifier satisfy the metric associated with the output power of the power amplifier when the output power during the second state and the third state is within a range of powers from a target output power of the power amplifier.

14. The method of claim 1, further comprising:
obtaining a second output signal of the power amplifier in the second state or the third state in response to one or more criteria being satisfied.

15. The method of claim 14, wherein the one or more criteria is satisfied when a timer expires or a characteristic associated with the power amplifier changes by a threshold.

16. The method of claim 1, further comprising:
applying the predistortion to a second input signal in response to one or more criteria being satisfied; and
amplifying a version of the predistorted second input signal with the power amplifier in the third state or in a fourth state where the bias voltage is set to a fourth voltage.

17. The method of claim 16, wherein the one or more criteria are satisfied when a difference of a first output power associated with the first input signal and a second output power associated with the second input signal is within a threshold.

18. The method of claim 1, wherein applying the predistortion comprises applying the predistortion to the first input signal as a digital predistortion.

19. A method of signal amplification, comprising:
obtaining a first output signal of a power amplifier in a first state where a bias voltage is set to a first voltage less than a second voltage determined based on a first tracking mode;
determining a predistortion associated with the power amplifier based at least in part on the obtained first output signal;
applying the predistortion to a first input signal of the power amplifier; and
amplifying a version of the predistorted first input signal with the power amplifier in a second state where the bias voltage is set to a third voltage based on a second tracking mode, wherein the third voltage is less than the first voltage.

20. The method of claim 19, wherein determining the predistortion comprises amplifying the version of the first input signal with the power amplifier in the third state where the bias voltage is set to the second voltage while determining the predistortion.

21. An apparatus for signal amplification, comprising:
a power amplifier;
a power supply coupled to the power amplifier;
a memory comprising executable instructions; and
a controller coupled to the memory, to the power amplifier, and to the power supply, wherein the controller is configured to execute the executable instructions and cause the apparatus to:
amplify a version of a first input signal with the power amplifier in a first state where a bias voltage of the power amplifier is set to a first voltage with the power supply based on a first tracking mode,
obtain a first output signal of the power amplifier in a second state where the bias voltage is set to a second voltage with the power supply, wherein the second voltage is less than the first voltage,
determine a predistortion associated with the power amplifier based at least in part on the obtained first output signal,
apply the predistortion to the first input signal, and
amplify a version of the predistorted first input signal with the power amplifier in a third state where the bias voltage is set to a third voltage with the power supply based on a second tracking mode, wherein the third voltage is less than the first voltage.

22. The apparatus of claim 21, wherein a compression point associated with the power amplifier in the second state and the third state satisfies a threshold.

23. The apparatus of claim 21, wherein to apply the predistortion to the first input signal, the controller is further configured to execute the executable instructions and cause the apparatus to apply the predistortion to the first signal after a single iteration of the obtaining and the determining.

24. The apparatus of claim 21, wherein:
to obtain the first output signal, the controller is further configured to execute the executable instructions and cause the apparatus to obtain the first output signal of the power amplifier in the second state where the bias voltage is only set to the second voltage; and
to amplify the version of the predistorted first input signal, the controller is further configured to execute the executable instructions and cause the apparatus to amplify the version of the predistorted first input signal with the power amplifier in the third state where the bias voltage is only set to the third voltage.

25. The apparatus of claim 21, wherein at least one of the first tracking mode or the second tracking mode comprises an average power tracking mode.

26. The apparatus of claim 21, wherein to amplify the version of the first input signal, the controller is further configured to execute the executable instructions and cause the apparatus to amplify the version of the first input signal based at least in part on a look-up table associated with an output power of the power amplifier.

27. The apparatus of claim 21, wherein to determine the predistortion, the controller is further configured to execute the executable instructions and cause the apparatus to amplify the version of the first input signal with the power amplifier in the first state while determining the predistortion.

28. The apparatus of claim 21, wherein the second state and the third state of the power amplifier satisfy a metric associated with an output power of the power amplifier.

29. The apparatus of claim 21, wherein the controller is further configured to execute the executable instructions and cause the apparatus to obtain a second output signal of the power amplifier in the second state or the third state in response to one or more criteria being satisfied.

30. An apparatus for signal amplification, comprising:
a power amplifier;
a power supply coupled to the power amplifier;
a memory comprising executable instructions; and
a controller coupled to the memory, to the power amplifier, and to the power supply, wherein the controller is configured to execute the executable instructions and cause the apparatus to:
obtain a first output signal of a power amplifier in a first state where a bias voltage is set to a first voltage less than a second voltage determined based on a first tracking mode,
determine a predistortion associated with the power amplifier based at least in part on the obtained first output signal,
apply the predistortion to a first input signal of the power amplifier, and
amplify a version of the predistorted first input signal with the power amplifier in a second state where the bias voltage is set to a third voltage based on a second tracking mode, wherein the third voltage is less than the first voltage.

* * * * *